United States Patent
Okayasu

(10) Patent No.: US 6,303,926 B1
(45) Date of Patent: Oct. 16, 2001

(54) OPTICAL SAMPLER

(75) Inventor: Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/348,478

(22) Filed: Jul. 7, 1999

(30) Foreign Application Priority Data

Jul. 7, 1998 (JP) ................................................. 10-191276

(51) Int. Cl.$^7$ ................................ G02B 6/00; G02F 1/35
(52) U.S. Cl. ........................ 250/225; 359/264; 324/76.36; 324/96
(58) Field of Search ............................... 250/216, 227.11, 250/227.14, 227.17, 225, 331.1; 356/345, 351; 385/2, 3, 11; 359/245, 246, 247, 248, 254, 257, 258, 264, 326; 324/76.36, 96; 708/816

(56) References Cited

U.S. PATENT DOCUMENTS

| | | | |
|---|---|---|---|
| 4,446,425 | * | 5/1984 | Valdmanis et al. ................ 324/76.36 |
| 4,843,586 | * | 6/1989 | Nazarathy et al. .................. 708/816 |
| 5,384,638 | | 1/1995 | Takahashi et al. . |
| 5,955,875 | * | 9/1999 | Twichell et al. ........................ 324/96 |
| 6,154,309 | * | 11/2000 | Otani et al. ........................... 359/326 |
| 6,219,172 | * | 4/2001 | Yariv .................................... 359/264 |

FOREIGN PATENT DOCUMENTS 19931 268.0-35  11/2000 (DE) .

* cited by examiner

Primary Examiner—John R. Lee
(74) Attorney, Agent, or Firm—Pillsbury Winthrop LLP

(57) ABSTRACT

A sampling device that samples a first signal by modulating a second signal using the first signal, comprising: a holding circuit that holds a value of the first signal; a modulator that modulates the second signal using a difference between the value held by the holding circuit and a present value of the first signal to produce a third signal indicating the difference; and an adder that adds the difference indicated by the third signal to the value held by the holding circuit. Preferably, the first signal is an electric signal, the second signal is an optical signal, and the modulator modulates the optical signal by applying to the optical signal an electric field formed by the electric signal.

21 Claims, 13 Drawing Sheets

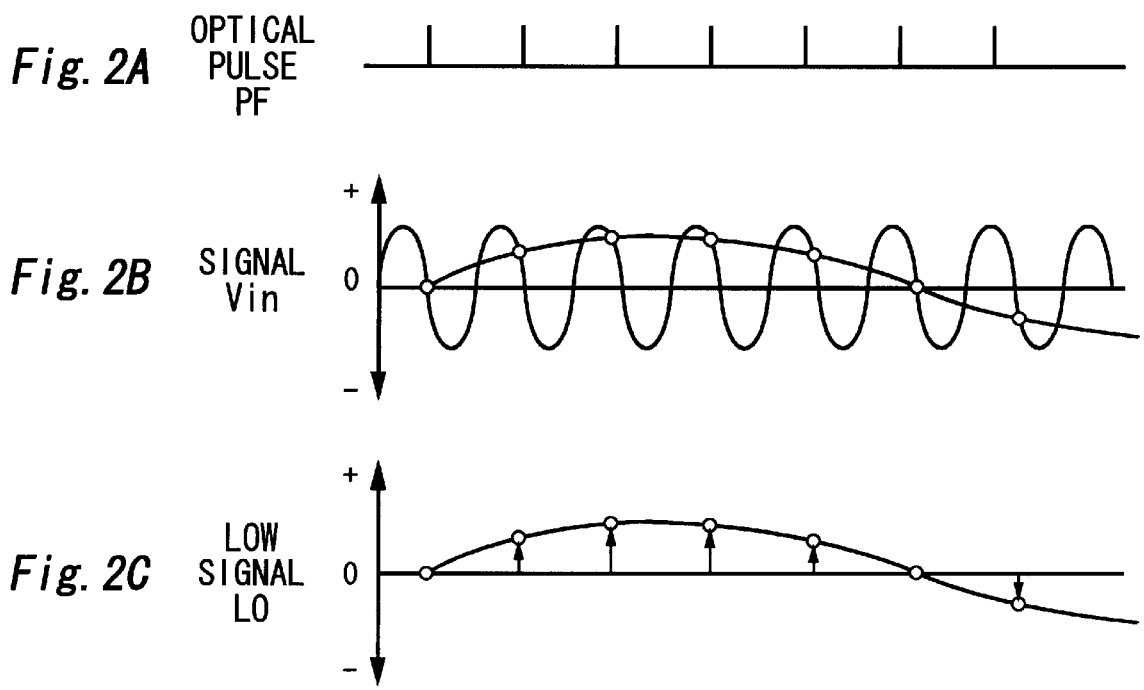
Fig. 2A OPTICAL PULSE PF
Fig. 2B SIGNAL Vin
Fig. 2C LOW SIGNAL LO
RELATED ART
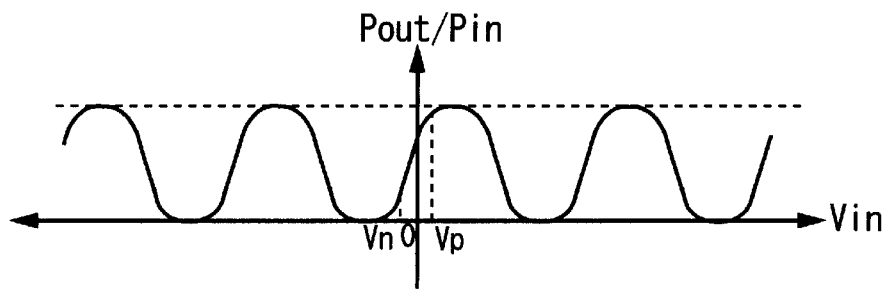
RELATED ART
Fig. 3

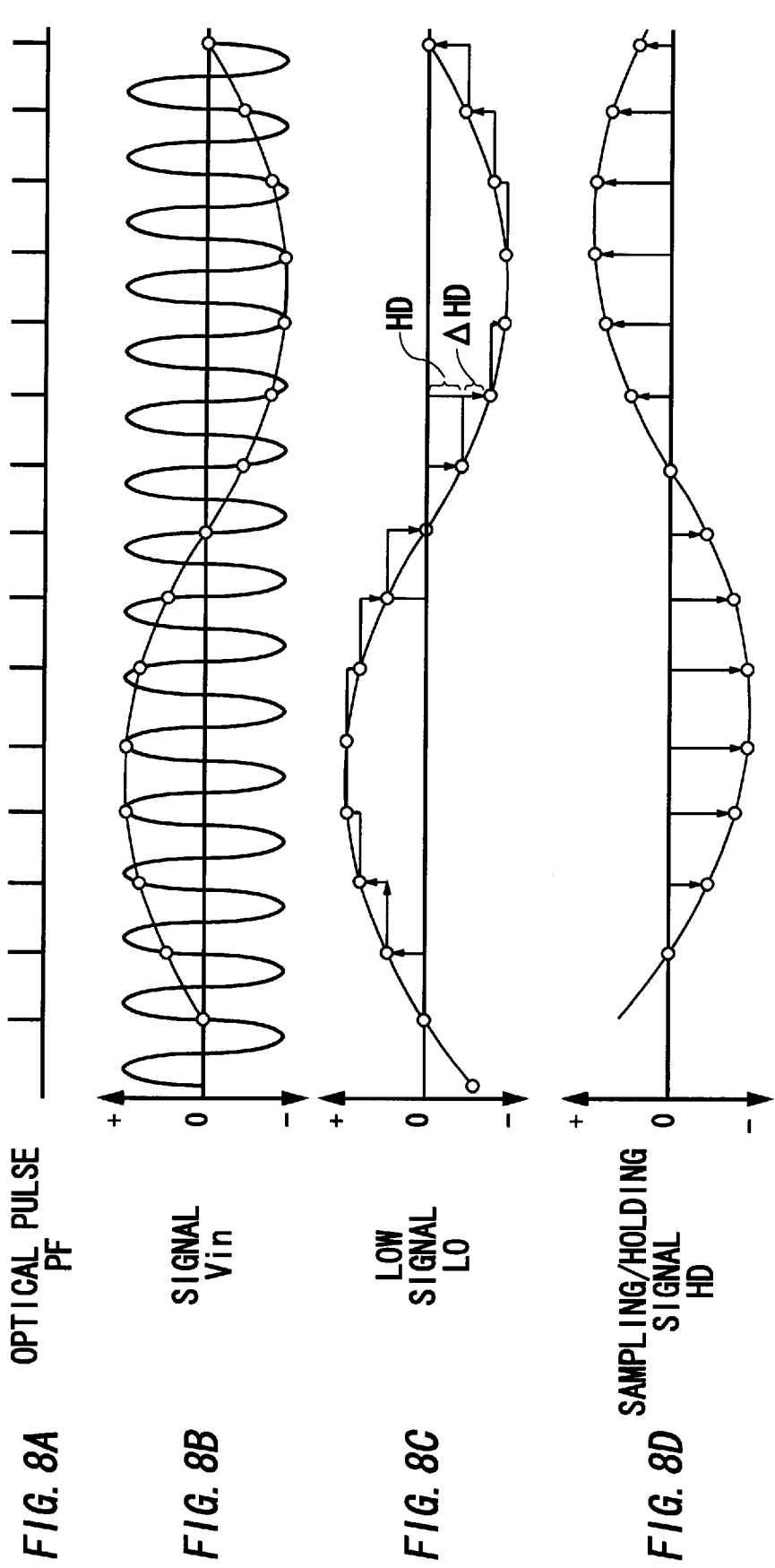

OPTICAL SAMPLER

This patent application claims priority based on a Japanese patent application, H10-191276 filed on Jul. 7, 1998, the contents of which are incorporated herein by reference.

BACKGROUND OF THE INVENTION

1. Field of the Invention

The present invention relates to an optical sampler that produces a low speed signal based on a high speed electric signal so that the high speed electric signal can be analyzed using the low speed electric signal.

2. Description of the Related Art

FIG. 1 schematically shows the structure of a typical optical sampler. In the figure, the signal source 1000 generates: a signal Vin, an electric signal changing at high speed, which is measured by the optical sampler. The optical sampler has an optical modulator 2000, a laser pulse source 3000, a polarizer 4000, an analyzer 5000, an optical detector 6000, a detecting circuit 7000, ad a holding circuit 6000. The optical modulator 2000 is of a bulk type, including, for example, an electrooptical effect crystal 2100, which can be made from $LiNbO_3$, and a pair of electrodes 2200A and 2200B opposing to each other.

FIG. 2A shows a waveform of an optical pulse PF output by the laser pulse source 3000, FIG. 2B shows a waveform of the signal Vin output by the signal source 1000, and FIG. 2C shows a waveform of the low speed signal LO output by the holding circuit 8000.

The optical pulse PF provided by the laser pulse source 3000 is polarized by the polarizer 4000, which feeds a polarized optical signal Pin to the optical modulator 2000. The sampling frequency of the optical pulse PF is set to be higher than the signal frequency of the signal Vin. Meanwhile, the signal Vin generated by the signal source 1000 is fed to the optical modulator 2000, whereby an electric field is applied to the electrooptical effect crystal 2100 using the pair of electrodes 2200A and 2200B.

The direction of the electric field is right-angled to the direction in which the optical signal Pin advances. Hence, by providing the polarization plane electric field to the electrooptical effect crystal 2100, the polarization plane of the optical signal Pin advancing through the electrooptical effect crystal 2100 is rotated according to the electric field. In other words, the angle of the polarization plane of the optical signal Pin is defined by the electric field, that is to say, by the signal Vin. In this way, the signal Vin is sampled using the polarized optical signal Pin, that is, the polarized optical signal Pin is modulated by the signal Vin. After being rotated, the optical signal Pin is input to the analyzer 5000 which subsequently outputs an optical signal Pout.

FIG. 3 shows a relationship between the signal Vin and the a ratio of the signal Pin to the signal Pout. The relationship is represented by a sine curve. In FIG. 1, it is assumed that the polarizer 4000 and the analyzer 5000 are set so that the difference between the angle of the polarization plane of the polarizer 4000 and that of the analyzer 5000 is 45 degrees. If there is no an electric field, that is to say, there is no signal Vin, a signal Pout corresponding to Vin=0 is fed from the analyzer 5000.

In FIG. 3, the characteristic near Vin=0 is as follows. If the signal Vin is positively applied, the polarization plane of the optical signal Pin is rotated clockwise by +θ. Thus, the optical signal Pout is increased according to the sine curve. For example, an optical signal Pout corresponding to Vin= Vp is output. On the contrary, if the signal Vin is negatively applied, the polarization plane of the optical signal Pin is rotated counterclockwise by θ (clockwise by −θ) . Thus, the optical signal Pout is decreased according to the sine curve. For example, the optical signal Pout corresponding to Vin= Vn is output. In summary, the ratio of the optical signal Pin to the optical signal Pout depends upon the angle of the polarization plans given by the optical signal Pin, and therefore depends upon the signal Vin.

The optical signal Pout fed by the analyzer 5000 undergoes optical/electric conversion in the optical detector 6000, whereby an electric signal corresponding to the optical signal Pout is produced and fed into the detecting circuit 7000. After receiving the electric signal, the detecting circuit 7000 amplifies it to output the amplified electric signal to the holding circuit 8000. The holding circuit 8000 carries out sampling/holding on the electric signal to provide the low speed signal LO. The frequency of the low speed signal LO is a beat frequency. In other words, the frequency is equal to the difference between the frequency of the signal Vin and the frequency of the optical pulse PF or the optical signal Pin. Accordingly, the change in the signal Vin can be represented by the low signal LO.

FIG. 4 shows the structure of an optical interferometer type optical modulator 9000. Unlike the optical modulator 2000 of FIG. 1, the optical modulator 9000 comprises a plate 9100 made of electrooptical effect crystal such as $LiNbO_3$. The optical modulator 9000 further includes an input port 9000A, an output port 9000B, a division port 9000C, a combination port 9000D, and optical paths 9000E-1 and 9000E-2. The input port 9000 is formed on a side of the plate 9100 while the output port 9000B is formed on the opposite side thereof. The division port 9000C and the combination port 9000D are formed between the input port 9000A and the output port 9000B, wherein the optical paths 9000E-1 and 9000E-2 are formed in parallel with each other therebetween.

An electrode 9200A is formed along the optical path 9000E-1, an electrode 9200B is formed between the optical path 9000E-1 and the optical path 9000E-2, and an electrode 9200C is formed along the optical path 9000E-2. The signal Vin generated by the signal source 1000 is applied across the electrodes 9200A and 9200B, while both the electrodes 9200B and 9200C are grounded. The laser pulse source 3000 is connected to the input port 9000A, and the optical detector 6000 is connected to the output port 9000B.

The optical pulse PF generated by the laser pulse source 3000 Is fed into the input port 9000 A to be divided into two components at the division port 9000C. One component advances along the optical path 9000E-1, while the other component advances along the optical path 9000E-2. The former component changes in propagation velocity through the electric field formed by the signal Vin, while the velocity of the latter component remains unchanged. Hence, the components interfere with each other according to the change of the former component in the propagation velocity at the combination port 9000D. The light that is phasemodulated along the optical path 9000E-1 is combined at the combination port 9000D to be an amplitude modulation light by interference. Consequently, the amplitude modulation light, that is, an intensity modulation light is output from the output port 9000B.

FIG. 5 shows a relationship between the signal Vin and the ratio of the signal Pout to the signal Pin. Here, unlike the above bulk-type optical modulator accompanied by the polarizer, the optical signal PF is identical with the optical signal Pin. The relationship is given on assumption that the length of the optical path 9000E-1 and that of the optical path 9000E-2 are equivalent to each other. In the figure, with respect to the characteristic when the signal Vin is zero or near zero, Vin=0 provides the maximum ratio while both Vin>0 and Vin<0 provides other ratios smaller than the maximum ratio.

FIG. 6 shows another relationship between the signal Vin and the ratio of the signal Pout to the signal Pin. The relationship is given based on an assumption that the length of the optical path 9000E-1 differs from that of the optical path 9000E-2 by $\lambda/4$ where $\lambda$ denotes the wavelength of light. The characteristic around Vin=0 in FIG. 6 is widely and sharply linear similar to the relationship in FIG. 3 concerning the optical modulator 2000. Accordingly, this characteristic is more useful than that in FIG. 5.

As described above, the signal Vin can be sampled using either the bulk-type optical modulator 2000 or the interference-type optical modulator 9000. However, with respect to the characteristic of the signal Vin—the optical signal Pout, the linear range of the sine curve around Vin=0 is rather small. Therefore, it the amplitude of the signal Vin excesses the linear range, the optical signal Pout or the low speed signal Lo distorted, which disables accurate measurement of the high speed signal Vin using the low speed signal LO.

SUMMARY OF THE INVENTION

Therefore, it is an object of the present invention to provide an optical sampler which overcomes the above issues in the related set. This object is achieved by combinations described in the independent claims. The dependent claims define further advantageous and exemplary combinations of the present invention.

According to an aspect of the present invention, there is provided a sampling device that samples a first signal by modulating a second signal using the first signal, comprising: a holding circuit that holds a value of the first signal; a modulator that modulates the second signal using a difference between the value held by the holding circuit and a present value of the first signal to produce a third signal indicating the difference; and an adder that adds the difference indicated by the third signal to the value held by the holding circuit.

According to another aspect of the present invention, there is provided a sampling method of sampling a first signal by modulating an optical signal using the first signal, comprising: holding a value of the first signal: modulating the optical signal according to a difference between the first signal and the value held by the holding circuit to produce the third signal including the difference; and adding the difference in the third signal to the value held by the holding circuit.

According to still another aspect of the present invention, there is provided a sampling device that measures an electric signal produced by a semiconductor device by modulating an optical signal using the electric signal, comprising: a holding circuit that holds a value of the electric signal; a modulator that modulates the optical signal by forming an electric field using the value held by the holding circuit and the electric signal to produce a difference signal indicating a difference between the value held by the holding circuit and a present value of the electric signal; and an adder that adds a value indicated by the difference signal to the value held by the holding circuit.

This summary of the invention does not necessarily describe all necessary features so that the invention may also be a sub-combination of these described features.

BRIEF DESCRIPTION OF THE DRAWINGS

FIGS. 2A–2C show waveforms of signals in FIG. 1;

FIG. 3 shows a characteristic of an optical modulator of a bulk type;

FIGS. 8A–8D show waveforms of signals in FIG. 7;

DETAILED DESCRIPTION OF THE INVENTION

The invention will now be described based on preferred embodiments, which do not intend to limit the scope of the present invention, but rather to exemplify the invention. All of the features and the combinations thereof described in the embodiment are not necessarily essential to the invention.

<First Embodiment>

Figure 7:
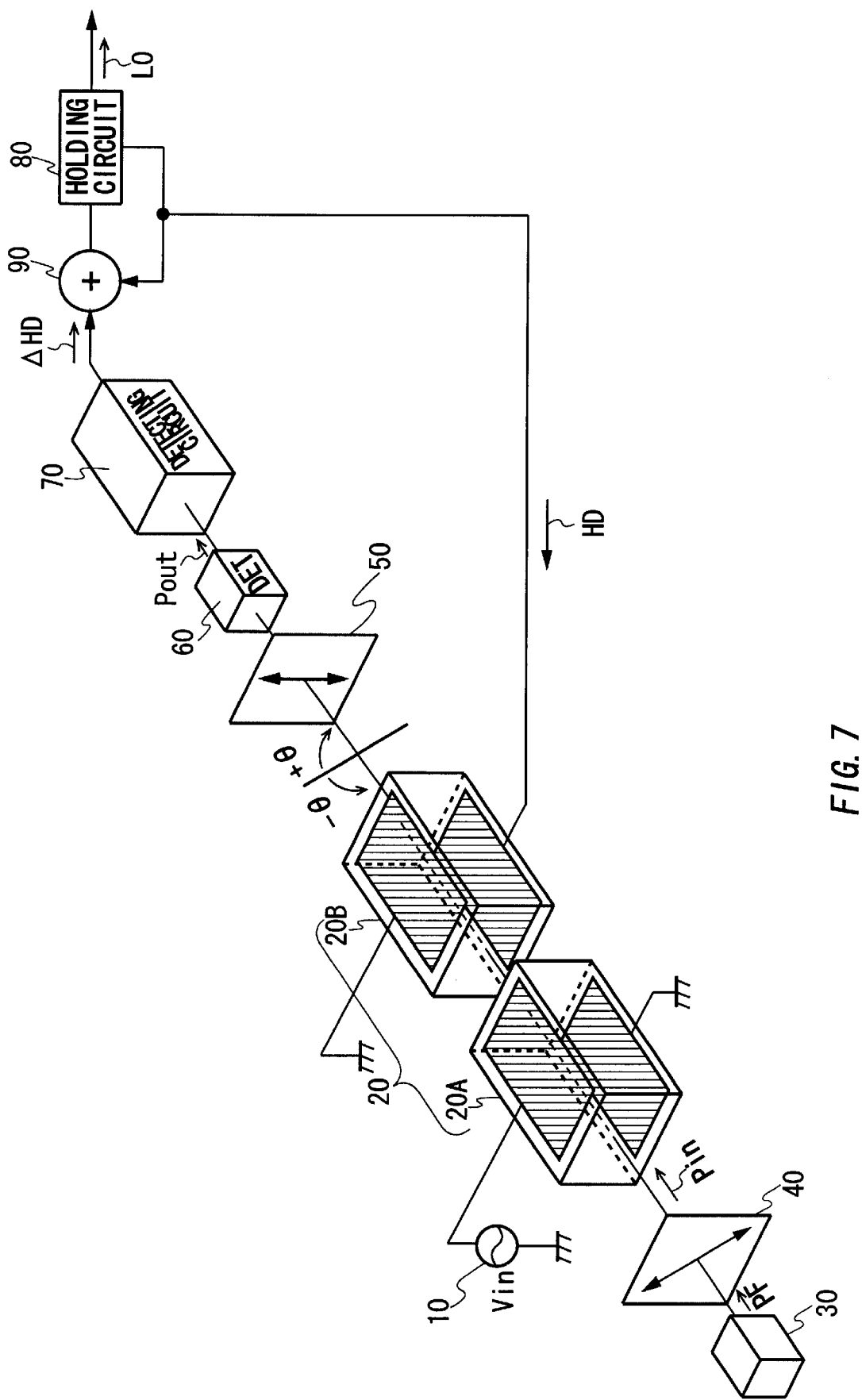
FIG. 7 shows the structure of an optical sampler of the first embodiment.

FIG. 7 shows the structure of the optical sampler of the first embodiment. To sample the signal Vin being measured, the optical sampler has an optical modulator 20, a laser pulse source 30, a polarizer 40, an analyzer 50, an optical detector 60, a detecting circuit 70, a holding circuit 80, and an adder 90. The optical modulator 20 further comprises a first optical modulator 20A and a second optical Adulator 20B. Both the first and second optical modulators 20A and 20B are of a bulk type. As shown in FIG. 3, the modulator 20 modulates the optical signal Vin more strongly as the signal is larger.

More specifically, the signal Pout changes almost linearly in the area ranging from $-\lambda/2$ to $\lambda/2$, and in particular the linearity is sharper closer to Vin=0. Further, the electrode of the first modulator 20A to which the signal Vin is applied opposes to the electrode of the second modulator 20B to which the signal HD is applied, with respect to the direction in which the optical signal Pin advances. The modulator 20 rotates the optical signal Pin according to the electric field corresponding to the difference between the usual Vin and the signal HD. Both the directions of the electric fields in the first optical modulator 20A and the second optical modulator 20B are right-angled to the direction in which the optical signal Pin advances.

The signal Vin generated by the signal source 10 is applied to the first optical modulator 20A and the sampling/holding signal HD is applied to the second optical modulator 20B so that the electric field formed by the signal Vin is inverse to the electric field formed by the sampling/holding signal HD. The holding circuit 80 holds the previous value of the first signal Vin as the sampling/holding signal HD. By applying the current sampled signal Vin to the first optical modulator 20A and applying the previous value of the signal Vin to the second optical modulator 20B, the difference between the current value and the previous value is provided. The difference lies in the optical signal fed from the optical modulator 20.

FIG. 8A shows a waveform of the optical pulse PF output by the laser pulse source 30, FIG. 8B shows a waveform of the signal Vin generated by the signal source 10, FIG. 8C shows a waveform of the low speed signal LO provided by the holding circuit 80, and FIG. 8D shows a waveform of the sampling/holding signal HD fed into both the second optical modulator 20B and the adder 90. Because the operation of the circuits other than the optical modulator 20, the holding circuit 80, and the adder 90 are almost the same as those of the related set, the detailed explanation below will focus on the improved features of this embodiment.

The first optical modulator 20A is provided with the signal Vin from the signal source 10 shown in FIG. 8B. The present value of the signal Vin generates an electric field as outlined above in the first optical modulator 20A. Meanwhile, as shown in FIG. 8A, the laser pulse source 30 generates an optical pulse PF, which is polarized in the polarizer 40. The polarized optical signal Pin is fed into the first optical modulator 20A. In this way, the polarization plane of the optical signal Pin is rotated clockwise according to this electric field, whereby the rotated or modulated optical signal Pin is fed into the second optical modulator 20B. In short, the first modulator 20A modulates the optical signal Pin according to a present value of the signal Vin.

The second optical modulator 20B is applied the sampling/holding signal HD by the holding circuit 80. The electric field generated by the sampling/holding signal HD, that is, the electric field generated by the value of the signal Vin held by holding circuit 80 is inverse to the electric field in the first optical modulator 20A. Therefore, the polarization plane of the received optical signal Pin is rotated counterclockwise according to the electric field in the second optical modulator 20B.

That is, the second modulator 20B modulates the optical signal Pin according to the value of the signal Vin held by the holding circuit 80. Consequently, the optical signal Pout output by the second optical modulator 20B indicates an angle corresponding to the difference between the signal Vin that is sampled this time and the signal that has been sampled last time. In other words, the modulator 20 modulates the optical signal Pin according to the difference between the value of the signal Vin held by the holding circuit 80 and the present value of the signal Vin. This optical signal Pout is fed into the analyzer 50 for analysis. The optical signal Pout undergoes an optical/electric conversion in the optical detector 60 and further the electric signal experiences amplification in the detecting circuit 70, thus being an electric signal ΔHD denoting the above difference.

The adder 90 adds the difference ΔHD to the sampling/holding value HD held by the holding circuit 80. In other words, the adder 90 adds the difference ΔHD, which is the difference between the value of the signal Vin held by the holding circuit 80 and the present value of the signal Vin, to the value of the signal Vin held by the holding circuit 80. Here, the sampling/holding value HD denotes the signal Vin sampled last time. Thus, the adder 90 provides a new sampling/holding value HD denoting the signal Vin sampled this time. The new sampling/holding value HD is fed into the holding circuit 80. The holding circuit 80 provides the new sampling/holding value HD to both the second optical modulator 20B and the adder 90, as shown in FIG. 8D. Simultaneously, the holding circuit 80 outputs the new sampling/holding value HD as the low speed signal LO, as shown in FIG. 8C. In this way, the sampling/holding value HD is continually updated.

Consequently, the second optical modulator 20B rotates the polarization plane of the optical signal Pin counterclockwise corresponding to the signal Vin sampled last time while the first optical modulator 20A rotates the polarization plane of the optical signal Pin clockwise corresponding to the signal Vin sampled this time. Therefore, the optical modulator 20 can always provide the optical signal Pout that is polarized by an angle according to the difference between the signal Vin sampled this time and the immediately preceding signal Vin, that is, according to the difference between the present value of the signal Vin and the value of the signal Vin which is held by the holding circuit 80.

Because this angle is smaller than the angle that the polarization plane of the optical signal Pout is rotated according to the signal Vin being sampled this time, it is possible to use a linear range closer to Vin=0 in FIG. 3 than in the related set. Hence, the distortion accompanying the optical signal Pout or the low speed signal LO becomes reduced. In short, even though the optical modulator 20 has the characteristic of FIG. 3, a linear range closer to Vin=0 is consistently available because the maximum of the difference between the signal Vin sampled this time and the previously sampled signal Yin sampled last time is always smaller than the maximum of the signal Vin sampled this time.

Figure 9A:
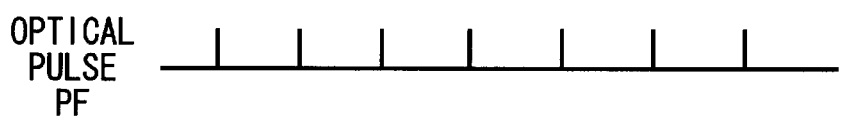
FIGS. 9A–9D show waveforms of signals in FIG. 7.
Figure 9B:
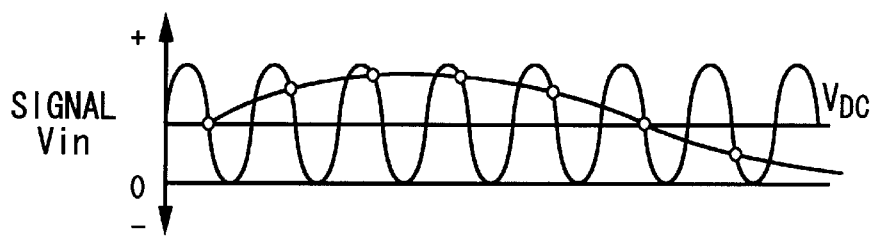
Figure 9C:
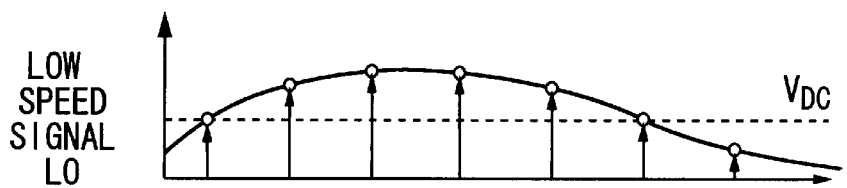
Figure 9D:
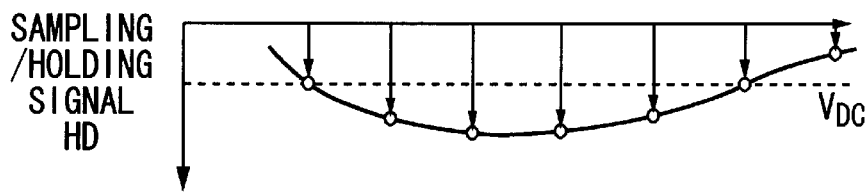

FIG. 9A shows another waveform of the optical pulse PF, FIG. 9B shows another waveform of the signal Vin, FIG. 9C shows another waveform of the low speed signal, and FIG. 9D shows another waveform of the sampling/holding signal HD. In FIG. 8B, the signal Vin is an alternating current; however, the signal Vin may be a combination of an alternating current and a direct current Vdc. Similar to above, the noise accompanying such a signal Vin can also be reduced.

<Second Embodiment>

Figure 10:
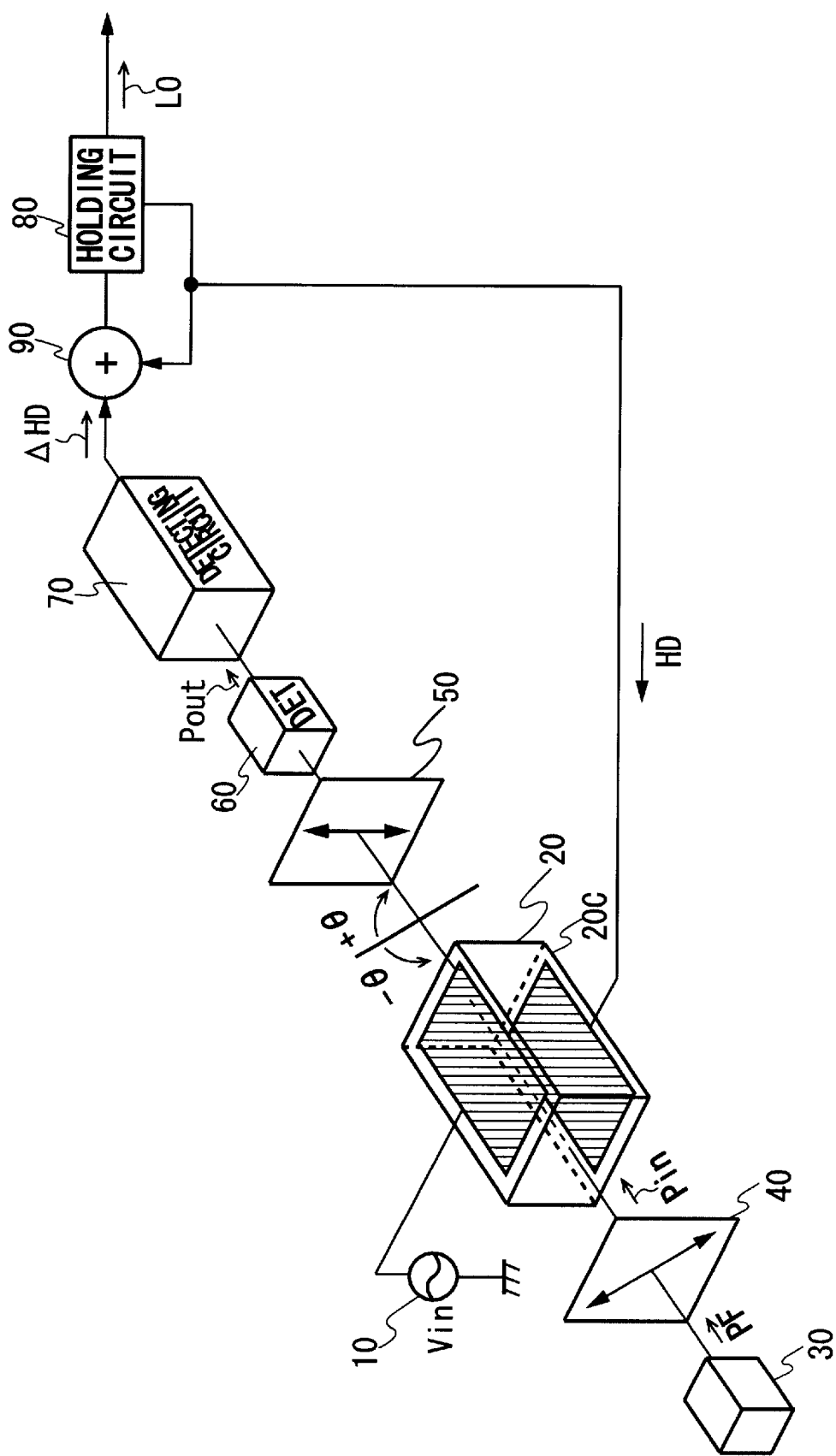
FIG. 10 shows the structure of an optical sampler of the second embodiment.

An optical sampler of a second embodiment of the present invention will now be discussed with reference to FIG. 10. FIG. 10 shows the structure of the second embodiment. As this structure is almost the same as that of the first embodiment, the following explanation will focus on the features of the second embodiment.

While in the first embodiment the optical modulator 20 incorporates the first optical modulator 20A that rotates the optical signal Pin clockwise and the second optical modulator 20B that rotates the optical signal Pin counterclockwise, in the second embodiment, the optical modulator 20 incorporates only an optical modulator 20C. This optical modulator 20C has the functions of both the first and second optical modulators 20A and 20B. Specifically, the signal Vin generated by the signal source 10 is applied to an electrode of the optical modulator 20C while the sampling/holding signal HD held by the holding circuit 80 is applied to the opposite electrode.

Hence, the optical modulator 20C rotates the polarization plane of the optical signal Pin clockwise according to the signal Vin and also rotates it counterclockwise according to the sampling/holding signal HD. In short, the optical modulator 20C rotates the polarization plane of the optical signal Pin clockwise or counterclockwise according to a electric field corresponding to the difference between the signal Vin and the sampling/holding signal HD. Since the sampling/holding signal HD indicates the previously sampled signal Vin, the optical modulator 20C outputs the optical signal Pout having an angle corresponding to the difference between the signal Vin being sampled and the previous signal Vin. In this way, analogously to the first embodiment, the optical modulator 20C serves to prepare a low speed signal LO with less distortion.

<Third Embodiment>

Figure 11:
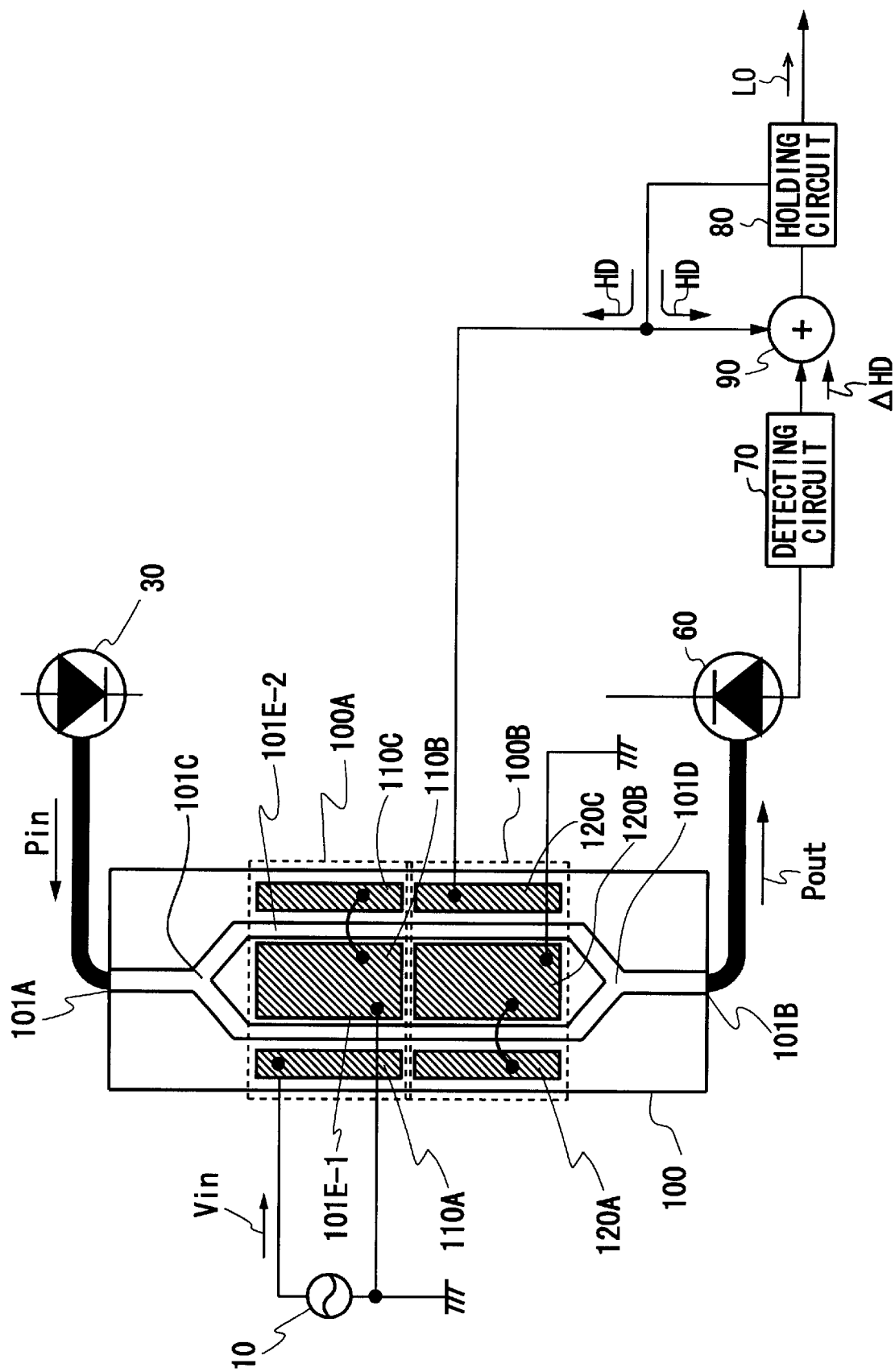
FIG. 11 shows the structure of an optical sampler of the third embodiment.

A third embodiment of the optical sampler according to the present invention will now be described with reference to FIG. 11. FIG. 11 shows the structure of the optical sampler employing an optical modulator of optical interference type. In the figure, the optical modulator 100, includes a first optical modulator 100A and a second optical modulator 100B. The optical modulator 100 further includes a first optical path 101E-1 and a second optical path 101E-2, both of which pass through both the first and second modulators 100A and 100B. Specifically, in the first optical modulator 100A, an electrode 110C is formed along the first optical path 101E-1, an electrode 110C is formed along the second optical path 101E-2, and an electrode 110B is formed along both the first and second optical paths 101E-1 and 101E-2. Similar to in the first optical modulator 100A, an electrode 120A is formed along the first optical path 101E-1, an electrode 120C is formed along the second optical path 101E-2, and an electrode 120B is formed along both the first and second optical paths 101E-1 and 101E-2.

The operation of the optical modulator 100 will now be explained. The signal Vin generated by the signal source 10 is fed into the first optical modulator 100A while the sampling/holding signal RD held by the holding circuit 80 is fed into the second optical modulator 100B. More exactly, the signal Vin is applied across the electrodes 110A and 110B with the electrodes 110B and 110C being grounded as a reference voltage; the sampling/holding signal HD is applied across the electrodes 120B and 120C with the electrode 120A and 120B being grounded as a reference voltage. Thus, an electric field formed by the electrodes 110A and 110B based upon the signal Vin is applied to the path 101E-1; an electric field formed by the electrodes 120B and 120C based upon the sampling/holding signal HD is applied to the path 101E-2.

Meanwhile, the optical signal Pin generated by the laser pulse source 30 is input into the optical modulator 100 via the input port 101A. The optical signal Pin is divided into two components at the division port 101C. One component advances along the first optical path 101E-1 whereby the velocity thereof is decreased according to the signal Vin in the first optical modulator 100A. That is, the first component is delayed by the electric field formed by the signal Vin. The reason why velocity is changed is that the signal Vin changes the refractive index of the first path 101E-1. Similarly, the other component advances along the second optical path 101E-2 whereby the velocity thereof is decreased according to the sampling/holding signal HD. That is, the second component is delayed by the electric field formed by the sampling/holding signal HD. Here, whether the velocities of the those components are increased or decreased depends upon the material of the optical modulator 100; Accordingly, both the velocities may be increased if the optical modulator 100 is made of other material.

Figure 1:
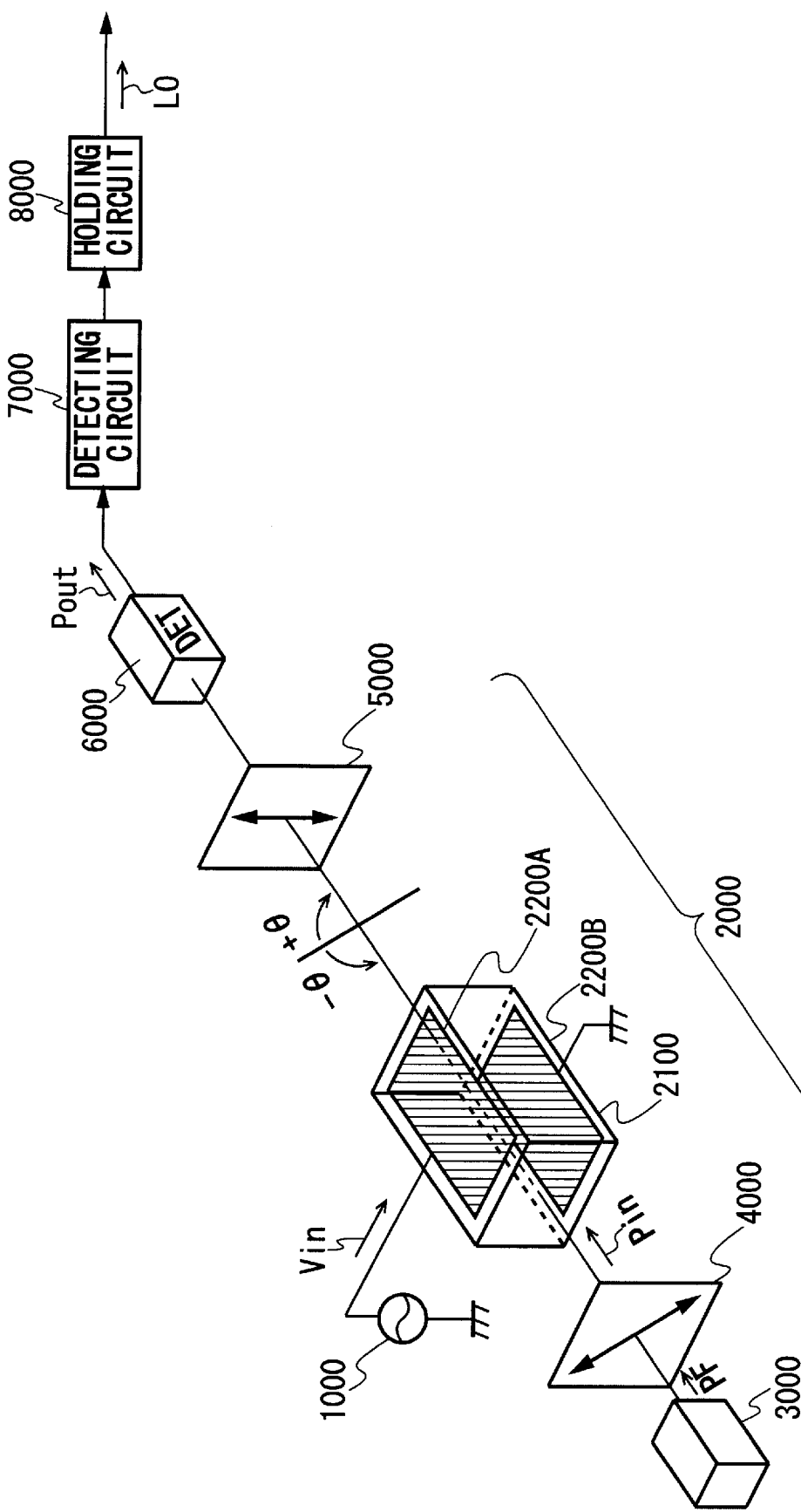
FIG. 1 shows the structure of a conventional optical sampler.
Figure 4:
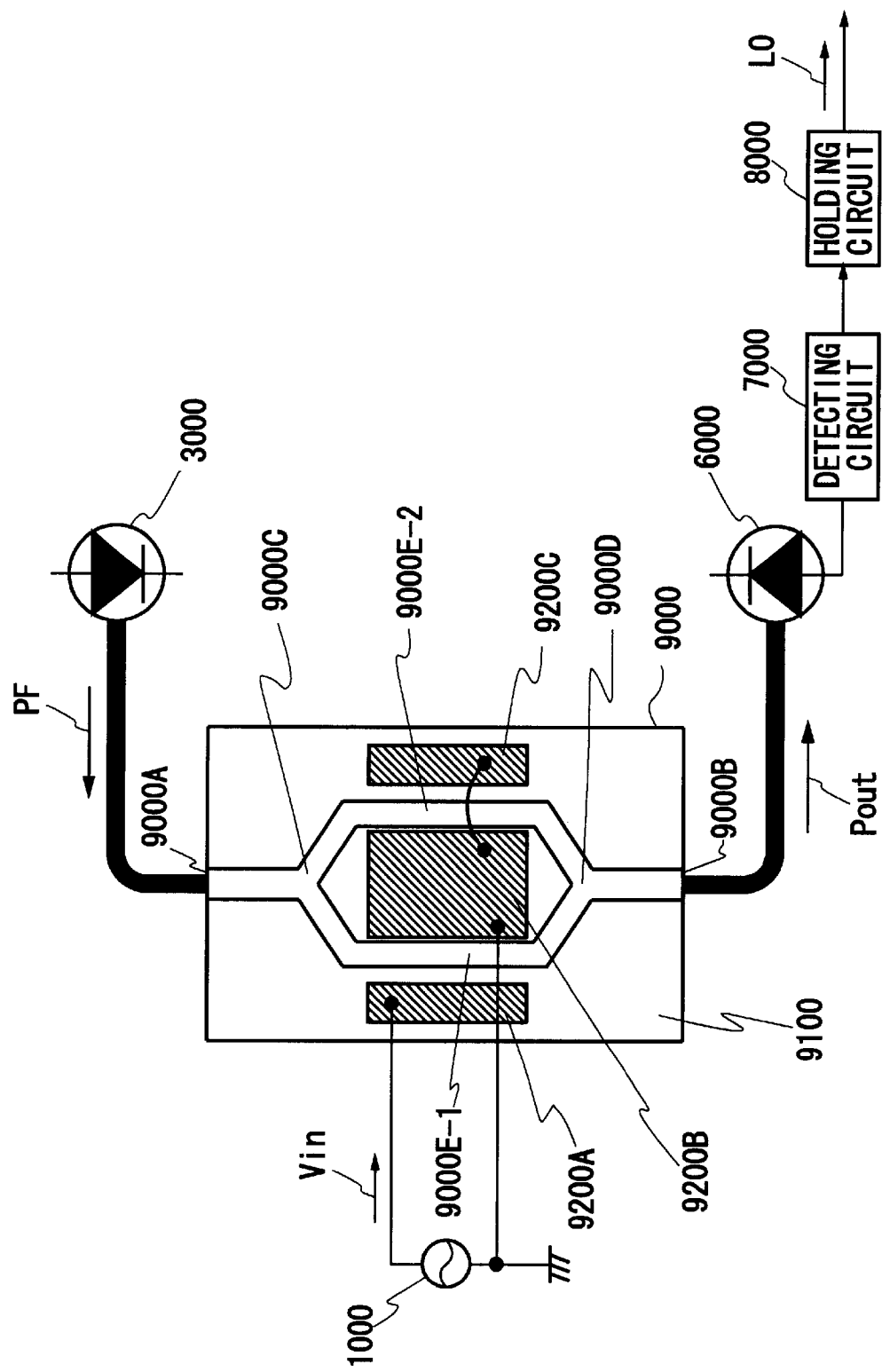
FIG. 4 shows the structure of an optical modulator of an interference type.
Figure 5:
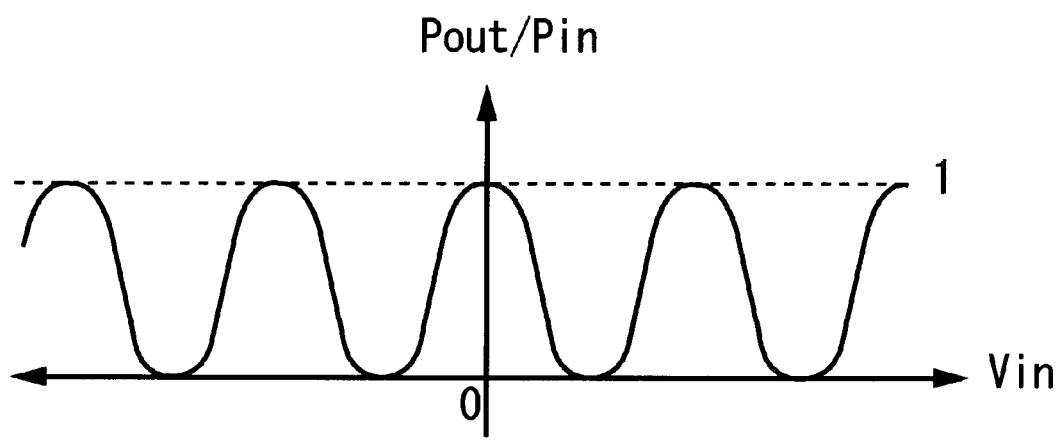
FIG. 5 shows a characteristic of the optical modulator of FIG. 4.

After passing through the first and second optical modulators 100A and 100B, the two components are combined at the combination port 101D, the combined optical signal Pout, the optical signal Pout modulated by the difference between the velocity of the former component and the velocity of the latter components is fed from the output port 101B. That is, the first component delayed by the signal Vin and the second component delayed by the sampling/holding signal HD are combined at the combination port 101D. Hence, analogous to the optical signal Pout of the first embodiment, the optical signal Pout of this embodiment is produced with less distortion based upon the sine curve of FIG. 5 or FIG. 6.

Figure 6:
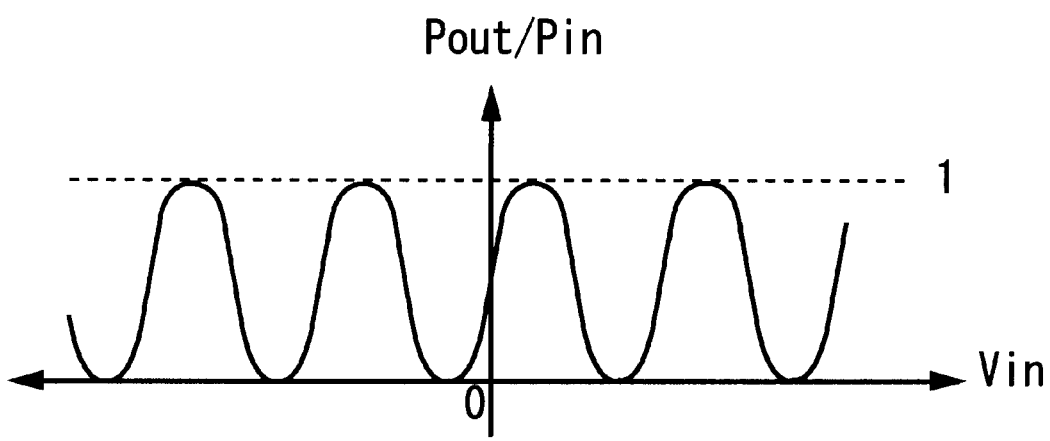
FIG. 6 shows another characteristic of the optical modulator of FIG. 4.

Further, if the difference between the length of the first optical path 101E-1 and that of the second optical path 101E-2 is set to be $\lambda/4$, the sine curve of FIG. 6 can be available. Such a setting can give a better optical signal Pout because the linear range of FIG. 6 is wider than that of FIG. 5.

<Fourth Embodiment>

Figure 12:
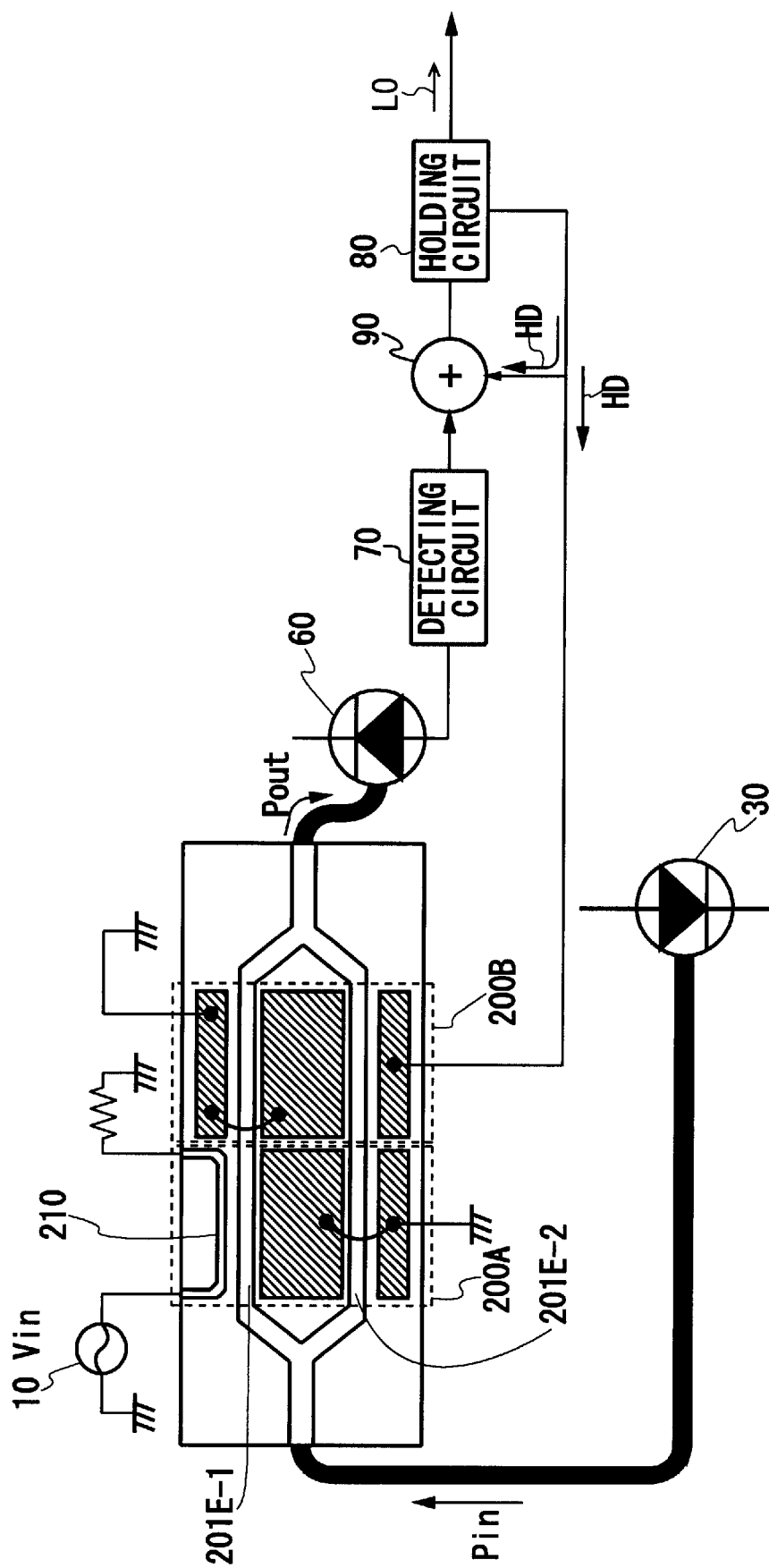
FIG. 12 shows the structure of an optical sampler of the fourth embodiment.

A fourth embodiment of the optical sampler according to the present invention will now be described with reference to FIG. 12. FIG. 12 shows the structure of the fourth embodiment. This optical sampler employs an optical modulator 200 of a traveling wave type. Because the structure of this embodiment is almost identical to that of the third embodiment, the following explanation will principally focus on the features of the fourth embodiment.

The optical modulator 200 incorporates a first optical modulator 200A and a second optical modulator 200B. The structures of the first and second optical modulators 200A and 200B are almost the same as those of the first and second optical modulator 100A and 100B in the third embodiment. However, unlike the first optical modulator 100A, the first optical modulator 200A includes a microstrip line 210 instead of the electrode 110A. The microstrip line 210 is formed along the optical path 201E-1. More specifically, the microstrip line 210 is formed in parallel with optical path 201E-1 so that the direction in which the signal Vin flows and the direction in which the optical signal Pin flows are the same. Thereby, the signal Vin flowing along the microstrip line 210 can modulate the optical signal Pin advancing along the optical path 201E-1. Consequently, similar to the case in the third embodiment, an optical signal Pout is produced that is the difference between the sampled signal Vin and the previous signal Vin.

Figure 13:
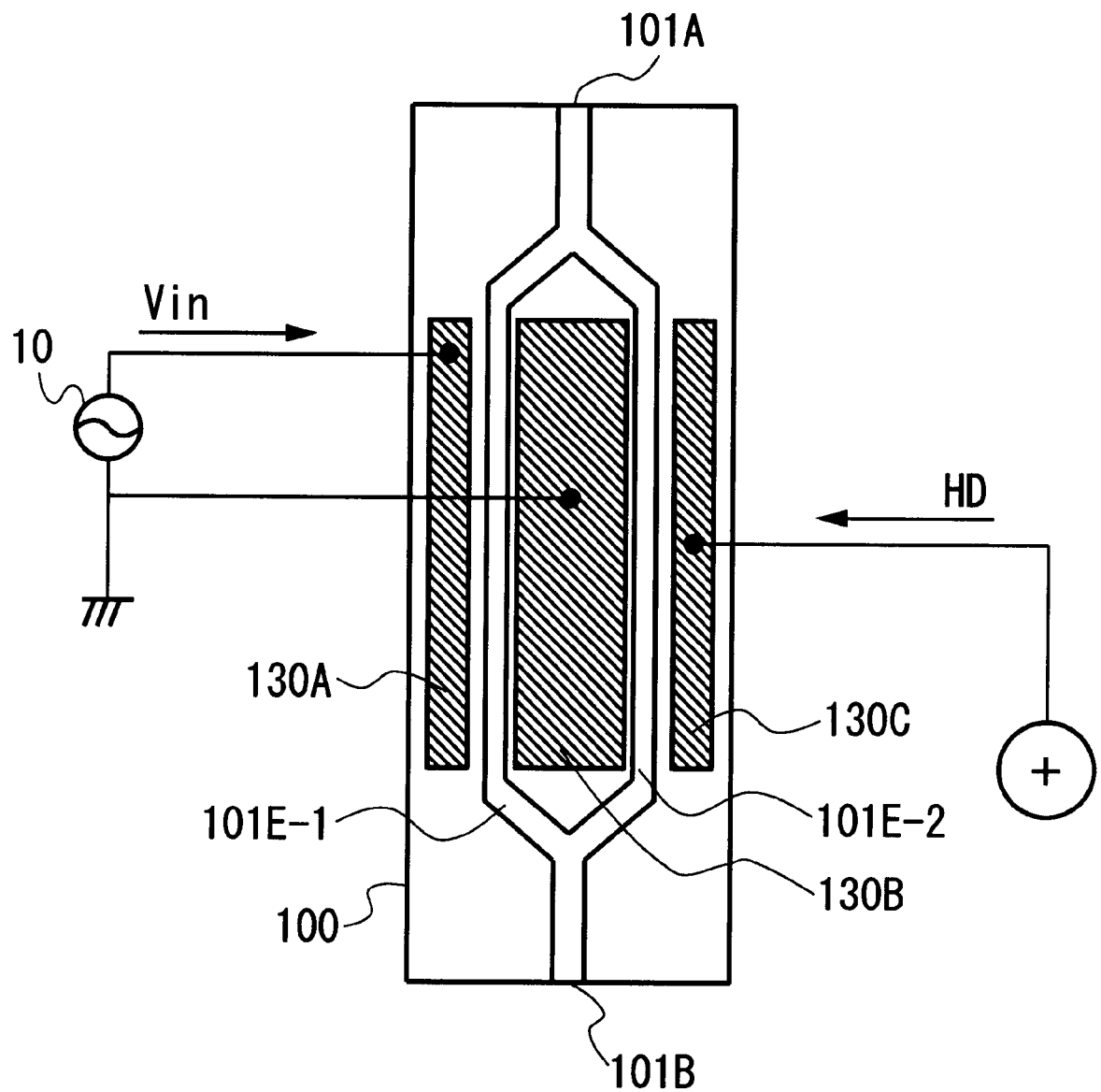
FIG. 13 shows the structure of another optical sampler of the third embodiment.
Figure 14:
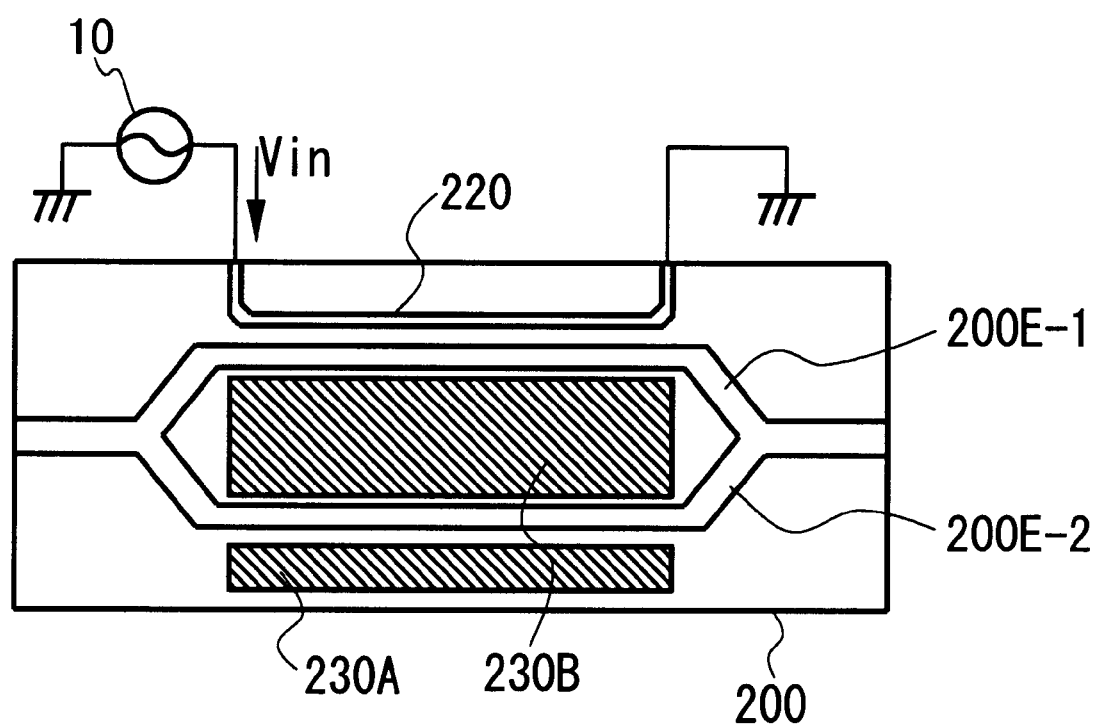
FIG. 14 shows the structure of another optical sampler of the fourth embodiment.

FIG. 13 shows the structure of another optical modulator of the third embodiment while FIG. 14 shows the structure of another optical modulator of the fourth embodiment. In FIG. 13, the optical sampler 100 incorporates electrodes 130A, 130B, and 130C, wherein the electrode 130A in formed wholly along the optical path 101E-1, the electrode 130C is formed wholly along the optical path 101E-2, and the electrode 130B is formed wholly along both the optical paths 101E-1 and 101E-2. The signal Vin is applied across the electrodes 130A and 130B like the electrodes 110A and 110B, and the electrode 110B is grounded as reference voltage. However, the signal HD is; applied to the electrode 130C directly. Such a compact configuration can also provide the same effect as that of the embodiment of FIG. 11.

Similarly, in FIG. 14, the optical sampler 100 incorporates a microstrip line 220 and electrodes 230A and 230B. The microstrip line 220 is formed wholly along the optical path 200E-1, to be applied the signal Vin. Meanwhile, the electrode 230A is formed wholly along the optical path 200E-2 and the electrode 230B is formed wholly along both the optical paths 200E-1 and 200E-2 with the electrode 230B grounded as reference voltage. Such a structure can also give the same effect as that of the embodiment of FIG. 12.

<Fifth Embodiment>

A fifth embodiment of the optical sampler according to the present invention will now be described referring to FIG.

Figure 15:
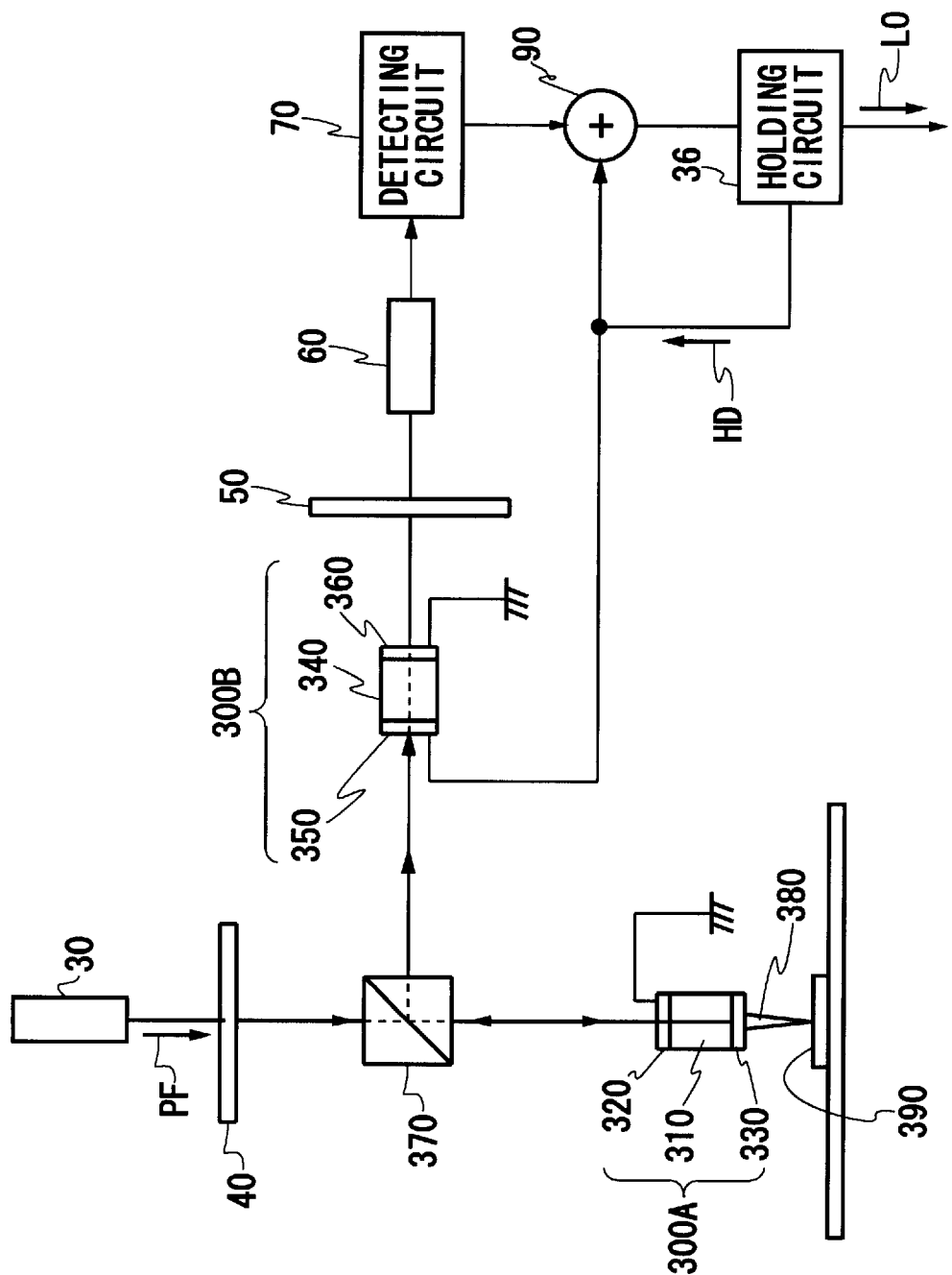
FIG. 15 shows the structure of an optical sampler of the fifth embodiment.

15. FIG. 15 shows the structure of the fifth embodiment. For ease of explanation and understanding, mainly the unique components of this embodiment will be discussed below. The optical sampler samples a signal Vin produced in a semiconductor device 390. In the figure, the optical sampler incorporates an optical modulator 300 of a reflection type and a beam splitter 370. The optical modulator 300 incorporates a first optical modulator 300A and a second optical modulator 300B. The first optical modulator 300A includes an electrooptical effect crystal 310, a transparent electrode 320, and a reflection electrode 330, while the second optical modulator 300B includes an electrooptical effect crystal 340, a transparent electrode 350, and a transparent electrode 360.

More specifically, in the first optical modulator 300A, the transparent electrode 320 and reflection electrode 330 are so placed that the direction in which the optical pulse PF advances is at right angle thereto. In other words, the direction of the optical pulse PF and the direction of the electric field formed by the electrodes 320 and 330 are parallel to each other. Further, the transparent electrode 320 is grounded whereas on the outer surface of the reflection electrode 330 is deposited a probe 380 that establishes or keeps contact with the semiconductor device 390. The signal Vin generated by the semiconductor device 390 is applied across the transparent electrode 320 and the reflection electrode 330 via the probe 380.

In the second optical modulator 300B, the transparent electrode 350 and the transparent electrode 360 are placed on opposite surfaces, so that the direction in which the incoming optical pulse PF advances is at a right angle to both the surfaces. Further, the sampling/holding signal HD is applied to the transparent electrode 350 while the transparent electrode 360 is grounded.

The operation in the fifth embodiment is as follows. The laser pulse source 30 outputs the optical pulse PF to the first optical modulator 300A via the polarizer 40 and the beam splitter 370. The optical pulse PF is rotated clockwise according to the electric field of the electrodes 320 and 330, that is, according to the signal Vin. Thereafter, the rotated optical pulse PF is reflected by the reflection electrode 330 to reach the second optical modulator 300B via the tranasparent electrode 320 and the beam splitter 370. In the second optical modulator 300B, the optical pulse PF is rotated counterclockwise according to the electric field of the electrodes 350 and 360, that is, according to the sampling/holding signal HD. In this way, similar to the above embodiments, the optical modulator 300 provides the optical pulse PF indicative of the difference between the sampled signal Vin s and the preceding signal Vin. A low speed signal LO with less distortion is thereby provided.

As described above, the optical sampler according to the present invention provides the difference between the latest signal Vin and a preceding signal Vin. Since the maximum value of the difference is smaller than the maximum value of the signal Vin itself, a linear range closer to Vin=0 in the sine curve is available, which can provide a low speed signal LO with less distortion.

While the optical samplers described in the above embodiments are of an electrooptical effect type, the optical sampler may also be of a magnetoopical type, which can provide the same effects of electrooptical effect type sampler.

Although the present invention has been described by way of exemplary embodiments, it should be understood that many changes and substitutions may be made by those skilled in the art without departing from the spirit and the scope of the present invention which is defined only by the appended claims.

What is claimed is:

1. A sampling device that samples a first signal by modulating a second signal using said first signal, comprising:

a holding circuit that holds a value of said first signal;

a modulator that modulates said second signal using a difference between said value held by said holding circuit and a present value of said first signal to produce a third signal indicating said difference; and an adder that adds said difference indicated by said third signal to said value held by said holding circuit.

2. A sampling device as set forth in claim 1, wherein said first signal is an electric signal, said second signal is an optical signal, and said modulator modulates said optical signal by applying to said optical signal an electric field formed by said electric signal.

3. A sampling device as set forth in claim 2, wherein said optical signal includes a polarization plane, said modulator rotates said polarization plane according to said difference to produce said third signal.

4. A sampling device as set forth in claim 3, wherein said modulator includes a first modulating unit that rotates said polarization plane in a first direction according to said value held by the holding circuit, and a second modulating unit that rotates said polarization plane in a second direction inverse to said first direction according to said first signal, and said third signal indicates a difference between a rotation by said first modulating unit and a rotation by said second modulating unit.

5. A sampling device as set forth in claim 4, wherein said first modulating unit rotates said polarization plane by a first electric field formed by said value held by said holding circuit, said second modulating unit rotates said polarization plane by a second electric field formed by said first signal, and a direction of said first electric field on the basis of a direction in which said optical signal advances is inverse to a direction of said second electric field thereon.

6. A sampling device as set forth in claim 5, wherein said first modulating unit includes a first pair of electrodes for forming said first electric field by applying thereto said value held by said holding circuit, said second modulating unit includes a second pair of electrodes for forming said second electric field by applying thereto said first signal, and an electrode of said first pair of electrodes to which said value held by said holding circuit is applied and an electrode of said second pair of electrodes to which said first signal is applied are opposite to each other on the basis of said direction in which said optical signal advances.

7. A sampling device as set forth in claim 3, wherein said modulator rotates said polarization plane by an electric field formed by said difference.

8. A sampling device as set forth in claim 7, wherein said modulator forms said electric field by a pair of electrodes, one of said pair of electrode being applied said value held by said holding circuit, and other or said pair of electrodes being applied said first signal.

9. A sampling device as set forth in claim 5, wherein directions of said first and second electric fields are right-angled to said direction in which said optical signal advances.

10. A sampling device as set forth in claim 6, wherein
directions of said first and second electric fields are in parallel with said direction in which said optical signal advances, and
at least an electrode of said first pair of electrodes and said second pair of electrodes is transparent.

11. A sampling device as set forth in claim 10, wherein
other electrode of said first pair of electrodes or other electrode of said second pair of electrodes reflects said optical signal.

12. A sampling device as set forth in claim 1, wherein
said modulator modulates said second signal more strongly as said difference is larger.

13. A sampling device as set forth in claim 3, wherein
said modulator delays said optical signal according to said value held by said holding circuit and said first signal, and produces as said third signal a difference between a delay amount of said optical signal according to said value held by said holding circuit and a delay amount of said optical signal according to said first signal.

14. A sampling device as set forth in claim 13, wherein said modulator includes:
a first modulating unit that delays said optical signal according to said value held by said holding circuit;
a second modulating unit that delays said optical signal according to said first signal; and
a combiner that combines said optical signal delayed by said first modulating unit and said optical signal delayed by said second modulating unit.

15. A sampling device as set forth in claim 14, wherein
said first modulating unit provides a first electric field for a path of said optical signal by a first pair of electrodes given said first signal and a reference voltage, and
said second modulating unit provides a second electric field for said path of said optical signal by a second pair of electrodes given said value held by said holding circuit and said reference voltage.

16. A sampling device as set forth in claim 15, wherein
an electrode of said first pair of electrodes to which said first signal is applied provides said first signal in parallel with a direction in which said optical signal advances.

17. A sampling device as set forth in claim 16, wherein
said electrode of said first pair of electrodes to which said first signal is applied includes a microstrip line that provides said first signal in parallel with a direction in which solid optical signal advances.

18. A sampling method of sampling a first signal by modulating an optical signal using said first signal, comprising:
holding a value of said first signal;
modulating said optical signal according to a difference between said first signal and said value held by said holding circuit to produce said third signal including said difference; and
adding said difference in said third signal to said value held by said holding circuit.

19. A sampling method as set forth in claim 18, wherein said modulating includes:
first rotating said polarization plane in a first direction according to said value held by said holding circuit; and
second rotating said polarization plane in a second direction inverse to said first direction according to said first signal.

20. A sampling method as set forth in claim 18, further comprising:
first delaying a velocity of said optical signal according to said value held by said holding;
second delaying a velocity of said optical signal according to said first signal; and
combining said optical signal delayed by said first delaying and said optical signal delayed by said second delaying to produce a third signal indicating a phase difference between a delay by said first delaying and a delay by said second delaying.

21. A sampling device that measures an electric signal produced by a semiconductor device by modulating an optical signal using said electric signal, comprising:
a holding circuit that holds a value of said electric signal;
a modulator that modulates said optical signal by forming an electric field using said value held by said holding circuit and said electric signal to produce a difference signal indicating a difference between said value held by said holding circuit and a present value of said electric signal; and
an adder that adds a value indicated by said difference signal to said value held by said holding circuit.

* * * * *